(12) United States Patent
Lai et al.

(10) Patent No.: US 9,425,391 B1
(45) Date of Patent: Aug. 23, 2016

(54) DAMASCENE PROCESS OF RRAM TOP ELECTRODES

(71) Applicant: Macronix International Co., Ltd., Hsinchu (TW)

(72) Inventors: Erh-Kun Lai, Elmsford, NY (US); Feng-Min Lee, Changhua (TW); Yu-Yu Lin, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/638,189

(22) Filed: Mar. 4, 2015

(51) Int. Cl.
*H01L 29/02* (2006.01)
*H01L 45/00* (2006.01)
*H01L 27/24* (2006.01)

(52) U.S. Cl.
CPC ........ *H01L 45/1253* (2013.01); *H01L 27/2409* (2013.01); *H01L 27/2436* (2013.01); *H01L 45/08* (2013.01); *H01L 45/1233* (2013.01); *H01L 45/146* (2013.01); *H01L 45/16* (2013.01)

(58) Field of Classification Search
CPC .................................................. H01L 45/1253
See application file for complete search history.

(56) References Cited

U.S. PATENT DOCUMENTS

| | | | | |
|---|---|---|---|---|
| 7,569,844 B2* | 8/2009 | Lung | ...................... | H01L 45/06 257/2 |
| 7,943,920 B2 | 5/2011 | Chien et al. | | |
| 7,978,496 B2 | 7/2011 | Kumar et al. | | |
| 8,279,656 B2 | 10/2012 | Chien et al. | | |
| 8,685,851 B2* | 4/2014 | Zhao | ...................... | H01L 27/101 257/751 |
| 9,209,225 B2* | 12/2015 | Lin | ...................... | H01L 27/2418 |
| 9,287,325 B2* | 3/2016 | Choi | .................. | G11C 13/0004 |
| 2010/0240189 A1* | 9/2010 | Jeong | .................. | H01L 21/7684 438/385 |
| 2011/0260133 A1* | 10/2011 | Sakamoto | .......... | G11C 13/0009 257/3 |
| 2012/0244698 A1* | 9/2012 | Ryan | ................. | H01L 21/76834 438/653 |
| 2013/0241037 A1* | 9/2013 | Jeong | .................. | H01L 21/7684 257/536 |
| 2014/0264237 A1 | 9/2014 | Chen et al. | | |

OTHER PUBLICATIONS

U.S. Appl. No. 14/598,116, filed Jan. 15, 2015, entitled "RRAM Process With Metal Protection Layer," 28 pages.

* cited by examiner

*Primary Examiner* — Matthew W Such
*Assistant Examiner* — Ali Naraghi
(74) *Attorney, Agent, or Firm* — Yiding Wu; Haynes Beffel & Wolfeld LLP

(57) ABSTRACT

A method is provided for manufacturing a memory. An insulating layer is formed over an array of interlayer conductors, and etched to define a first opening corresponding to a first interlayer conductor in the array, where the etching stops at a first top surface of the first interlayer conductor. A metal oxide layer is formed on the first top surface. A first layer of barrier material is deposited conformal with and contacting the metal oxide layer and surfaces of the first opening. Subsequently the insulating layer is etched to define a second opening corresponding to a second interlayer conductor in the array, where the etching stops at a second top surface of the second interlayer conductor. A second layer of barrier material is deposited conformal with and contacting the first layer of barrier material in the first opening. The first opening is filled with a conductive material.

12 Claims, 17 Drawing Sheets

DAMASCENE PROCESS OF RRAM TOP ELECTRODES

BACKGROUND

1. Field of the Technology

The present invention relates to metal oxide based memory devices and methods for manufacturing such devices.

2. Description of Related Art

Resistive random access memory, RRAM, is a type of nonvolatile memory that provides the benefits of small cell size, scalability, ultrafast operation, low-power operation, high endurance, good retention, large On/Off ratio, and CMOS compatibility. One type of RRAM includes metal oxide layers that can be caused to change resistance between two or more stable resistance ranges by application of electrical pulses at levels suitable for implementation in integrated circuits.

As integrated circuit manufacturing technology scales down, damascene process for forming top electrodes of RRAM cells becomes more suitable than line patterning. A RRAM cell can include an access device that has first and second terminals, a first plug that contacts the first terminal, and a second plug that contacts the second terminal. The access device can be a transistor or a diode. A metal oxide layer contacts a top surface of the first plug and acts as a memory element in a RRAM cell. An insulating layer is disposed over the first and second plugs, and has first and second openings corresponding to the first and second plugs. First and second top electrodes can be disposed in the first and second openings, and connected to a bit line and a source line, respectively.

In methods of manufacturing RRAM cells, for example, top surfaces of first and second plugs are oxidized to form a metal oxide layer before respective top electrodes are formed in the openings. The metal oxide layer at the top surface of the second plug is to be etched away, as the second plug is designed to electrically connect the second terminal of the access device to a source line. However, etching away the metal oxide layer at the top surface of the second plug in the second opening can cause damage to the second plug, leading to higher resistance in the second plug. Further, there can be contamination to side walls of the second opening in the insulating layer. For instance, if the second plug includes copper (Cu) and the metal oxide layer includes a copper oxide (CuOx), copper may be sputtered onto side walls of the second opening while the metal oxide layer is etched away in the second opening.

In addition, a photoresist mask is used to protect the metal oxide layer in the first opening while the metal oxide layer is etched away in the second opening. After etching, the photoresist mask is stripped and this stripping may damage the metal oxide layer in the first opening.

It is therefore desirable to provide a memory cell and method of manufacture that eliminates the possibility of damage to the plug connected to the source line caused by etching away the metal oxide layer, and the possibility of damage caused by photoresist stripping to the metal oxide layer that acts as a programmable resistance element, in order to provide a cost-effective method of manufacture.

SUMMARY

A method is provided for manufacturing a memory. A first opening is defined corresponding to a first interlayer conductor (also referred to as a plug), a metal oxide layer is formed on a top surface of the first interlayer conductor in the first opening, and a first layer of barrier material is deposited in the first opening, before a second opening is defined corresponding to a second interlayer conductor. Consequently, the method eliminates the possibility of damage to the second interlayer connector caused by etching away the metal oxide layer in the second opening, the possibility of contamination to side walls of the second opening in the insulating layer caused by etching away the metal oxide layer in the second opening, and the possibility of damage to the metal oxide layer in the first opening caused by photoresist stripping, as described in the related art.

In implementations, an insulating layer is formed over an array of interlayer conductors. The insulating layer is etched to define a first opening corresponding to a first interlayer conductor in the array, where the etching stops at a first top surface of the first interlayer conductor. A metal oxide layer is formed on the first top surface of the first interlayer conductor in the first opening. A diffusion barrier layer can be formed between top surfaces of the array of interlayer conductors and the insulating layer, and contacting the top surfaces, to prevent diffusion from the interlayer conductors and to stop etching of the first opening and the second opening at top surfaces of the array of interlayer conductors. A first layer of barrier material is deposited conformal with and contacting the metal oxide layer on the first interlayer conductor and surfaces of the first opening. The first layer of barrier material can protect the metal oxide layer from potential damage by subsequent manufacturing steps to form and then remove etch masks over the metal oxide layer, thus providing better interface between the metal oxide layer and the top electrode. The first opening can have a width greater than a width of the first interlayer connector. Subsequent to depositing the first layer of barrier material, the insulating layer is etched to define a second opening corresponding to a second interlayer conductor in the array, where the etching stops at a second top surface of the second interlayer conductor. A second layer of barrier material is deposited conformal with and contacting the first layer of barrier material in the first opening. The first opening is filled with a conductive material. The first and second interlayer conductors are connected to first and second terminals of an access device respectively.

When etching to define the first opening, a first etch mask can be used over the insulating layer, where the first etch mask has a mask region corresponding to the second opening and a spaced apart region corresponding to the first opening. When etching to define the second opening, a second etch mask can be used over the insulating layer, where the second etch mask has a mask region corresponding to the first opening and a spaced apart region corresponding to the second opening.

The second layer of barrier material can be deposited conformal with and contacting the second top surface of the second interlayer conductor in the second opening and surfaces of the second opening, and the second opening can be filled with the conductive material, where a layer comprised of a metal oxide is not present between the second top surface and the second layer of barrier material.

A first access line electrically connected to the metal oxide layer can be formed, and can act as a bit line. A second access line electrically connected to the second interlayer conductor can be formed, and can act as a source line.

An array of access devices coupled to the array of interlayer conductors can be formed, where the array includes the first mentioned access device. The first mentioned access device can include a diode or a transistor. In an embodiment where the first mentioned access device includes a transistor, a third access line electrically connected to a gate terminal of the transistor can be formed.

The metal oxide layer can be characterized by having a programmable resistance. The first interlayer connector can consist essentially of a metal, and the metal oxide layer can include an oxide of the metal. The first interlayer connector can consist essentially of a transition metal, and the metal oxide layer can include an oxide of the transition metal.

Other aspects and advantages of the present technology can be seen on review of the drawings, the detailed description and the claims, which follow.

DETAILED DESCRIPTION

Figure 1:
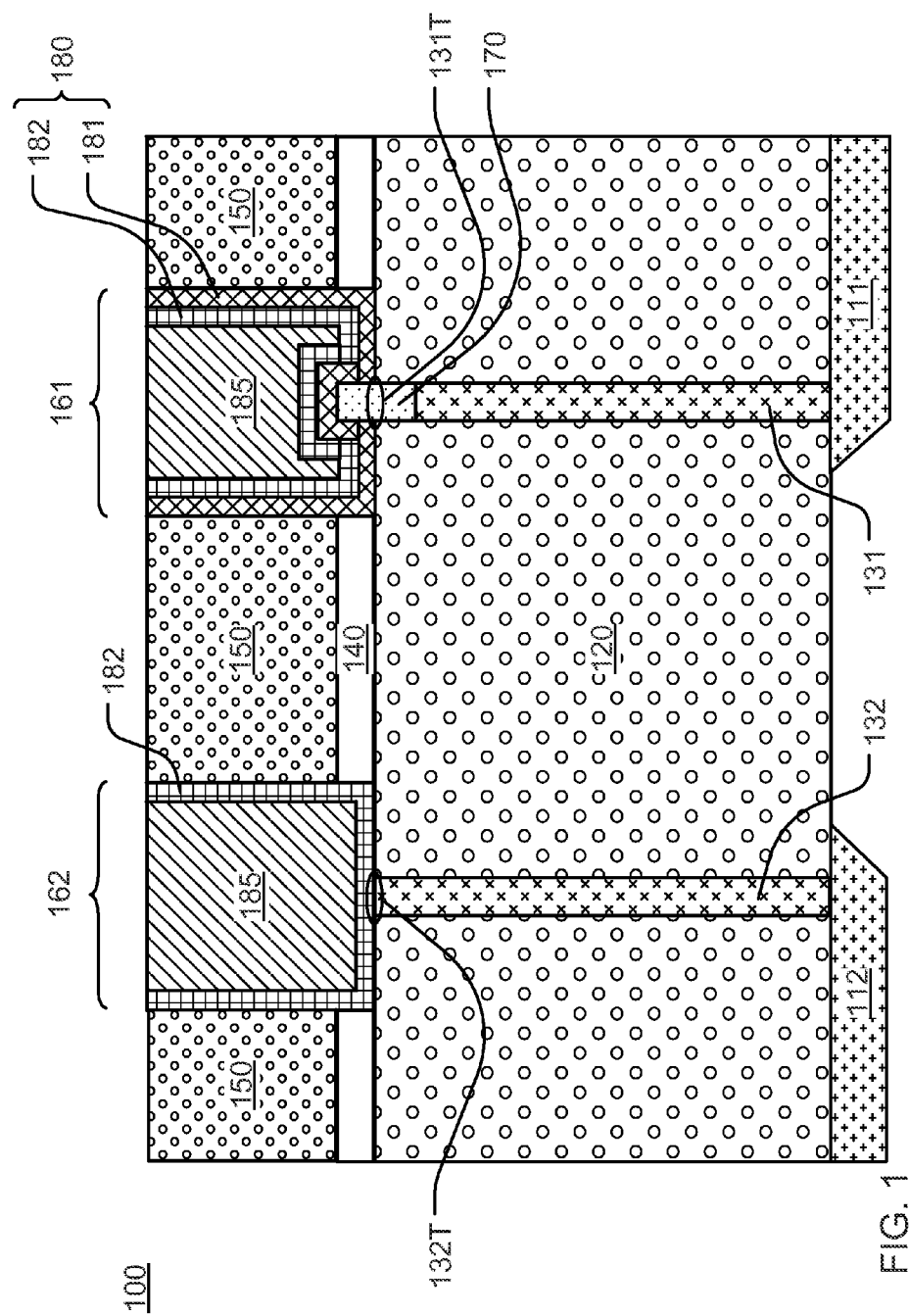
FIG. 1 illustrates a cross-sectional view of a memory cell in accordance with an embodiment.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 illustrates a cross-sectional view of a memory cell (e.g. 100) in accordance with an embodiment. A patterned insulating layer (e.g. 150) is disposed over an array of interlayer conductors (e.g. 131, 132). The patterned insulating layer (e.g. 150) includes a first opening (e.g. 161) corresponding to a first interlayer conductor (e.g. 131) in the array, and a second opening (e.g. 162) corresponding to a second interlayer conductor (e.g. 132) in the array. The first opening and the second opening extend through the patterned insulating layer, and stop at a first top surface (e.g. 131T) of the first interlayer conductor (e.g. 131) and a second top surface (e.g. 132T) of the second interlayer conductor (e.g. 132), respectively.

The first and second interlayer conductors (e.g. 131, 132) are comprised of electrically conductive elements. The interlayer conductors may be comprised of, for example, one or more elements selected from the group consisting of Ti, W, Mo, Al, Hf, Ta, Cu, Pt, It, La, Ni, N, O, and Ru, and combinations thereof, and in some embodiments may comprise more than one layer. In one implementation, the first and second interlayer conductors can consist essentially of a metal, and the metal oxide layer can comprise an oxide of the metal. In another implementation, the first and second interlayer conductors can consist essentially of a transition metal, and the metal oxide layer can comprise an oxide of the transition metal.

A metal oxide layer (e.g. 170) is disposed on the first top surface (e.g. 131T) of the first interlayer conductor (e.g. 131), while a layer comprised of a metal oxide is not present on the second top surface (e.g. 132T) of the second interlayer conductor (e.g. 132). The metal oxide layer can be characterized by having a programmable resistance so that the metal oxide layer is programmable to at least two resistance states. For instance, the metal oxide layer may comprise one or more tungsten-oxygen compounds (WOx), such as one or more of $WO_3$, $W_2O_5$, $WO_2$. The metal oxide layer can have a graded profile including $WO_3$, $W_2O_5$ and $WO_2$ such that the oxygen ratio in the metal oxide layer decreases from the first opening (e.g. 161) towards the first interlayer conductor (e.g. 131).

In the embodiment shown, the metal oxide layer 170 can be a single layer formed by oxidizing the top surface of the first interlayer conductor 131 and therefore is self-aligned with the first interlayer conductor 131. The metal oxide layer can extrude from the first top surface of the first interlayer conductor into the first opening due to volume expansion during forming the metal oxide layer. In alternative embodiments, the metal oxide layer 170 may comprise other metal oxides, for example a metal oxide from the group of nickel oxide, aluminum oxide, magnesium oxide, cobalt oxide, titanium oxide, titanium-nickel oxide, zirconium oxide, and copper oxide.

A diffusion barrier layer (e.g. 140) can be disposed between top surfaces of the array of interlayer conductors and the patterned insulating layer. The diffusion barrier layer (e.g. 140) can prevent diffusion from the interlayer conductors. For instance, the interlayer conductors can include highly diffusive materials, such as Cu (copper), that can cause reliability issues. The diffusion barrier layer (e.g. 140) can include SiN (silicon nitride). The diffusion barrier layer (e.g. 140) can also stop etching of the first opening and the second opening at top surfaces of the array of interlayer conductors. A thicker diffusion barrier layer may increase capacitance of the RRAM cell, while a thinner diffusion barrier layer may not be sufficient for preventing diffusion from the interlayer conductors or may not stop etching of the first and second openings at top surfaces of the interlayer conductors. In one embodiment, the diffusion barrier layer (e.g. 140) can have a thickness of about 30 nm (nanometer) within a range of 10 nm and 100 nm, to prevent diffusion from the interlayer conductors while not causing excessive capacitance.

A first barrier layer (e.g. 180) is disposed conformal with and contacting the metal oxide layer (e.g. 170) on the first interlayer conductor and surfaces of the first opening, including side and bottom surfaces of the first opening. The first barrier layer (e.g. 180) can include a first layer of barrier material (e.g. 181) and a second layer of barrier material (e.g. 182) conformal with and contacting the first layer of barrier material. In one embodiment, each of the first layer of barrier material and the second layer of barrier material of the first barrier layer (e.g. 181 and 182) can have a thickness of about 10 nm (nanometer) within a range of 1 nm and 50 nm.

A second barrier layer can include the second layer of barrier material (e.g. 182) and is disposed conformal with and contacting a second top surface (e.g. 132T) of the second interlayer conductor (e.g. 132) in the second opening and side and bottom surfaces of the second opening. The second barrier layer has a thickness thinner than a thickness of the first barrier layer 180. In one embodiment, the second barrier layer including the second layer of barrier material (e.g. 182) can have a thickness of about 10 nm (nanometer) within a range of 1 nm and 50 nm.

The first opening is filled with a conductive material (e.g. 185), contacting the first barrier layer (e.g. 180) in the first opening. The second opening is filled with the conductive material (e.g. 185), contacting the second barrier layer in the second opening. The first layer of barrier material (e.g. 181) and the second layer of barrier material (e.g. 182) can comprise one or more layers of different materials comprised of one or more elements selected from the group consisting of Ti, TiN, W, AlCu, TaN, Cu, Hf, Ta, Au, Pt, Ag, and other metals which are CMOS compatible and do not alter the variable resistance properties of the metal oxide layer.

The first and second interlayer conductors (e.g. 131, 132) are connected to first and second terminals (e.g. 111, 121) of an access device respectively. The first and second terminals of the access device are disposed at a side of the dielectric layer opposite the first opening and the second opening.

The array of interlayer conductors extends through a dielectric layer (e.g. 120). The dielectric layer (e.g. 120) can include oxide materials such as PE (plasma enhanced) oxide, PETEOS (plasma enhanced tetraethyl orthosilicate) oxide, LPTEOS low pressure tetraethyl orthosilicate) oxide, HDP (high density plasma) oxide, BPSG (borophosphosilicate glass film), PSG (phosphosilicate glass film), FSG (fluorosilicate glass film), low k materials and so on.

A first access line (not shown) can be electrically connected to the metal oxide layer, for example via the conductive material filled in the first opening, and act as a bit line of the memory cell. A second access line (not shown) can be electrically connected to the second interlayer conductor, for example via the conductive material filled in the second opening, and act as a source line of the memory cell. The first and second access lines can include one or more elements including Ti, W, Al, Cu, Pt, TaN, Hf, Ta and Ni. The first access line can include the same material as the second access line, or a different material than the second access line. The conductive material (e.g. 185) filled in the first opening (e.g. 161) and the second opening (e.g. 162) can be formed at metal layer 1 (ML1), while the first and second access lines can be formed at metal levels 2, 3, 4 or n (ML2, ML3, ML4, or . . . MLn). Furthermore, the first and second access lines can be formed at different metal levels. For example, the first access line can be formed at metal layer 3 (ML3), while the second access line can be formed at metal layer 4 (ML4).

The access device can include a diode or a transistor. In an embodiment where the access device includes a transistor, a third access line (not shown) can be electrically connected to a gate terminal of the transistor and act as a word line of the memory cell.

In operation, voltages applied between the first access line and first interlayer conductor 131 will cause current to flow between the first access line and the first interlayer conductor 131 via the metal oxide layer 170, and the first barrier layer 180. This current can induce a programmable change in electrical resistance of the metal oxide layer 170, the electrical resistance indicating a data value stored in the memory cell 100. In some embodiments the metal oxide layer 170 of the memory cell 100 can store two or more bits of data.

Figure 2:
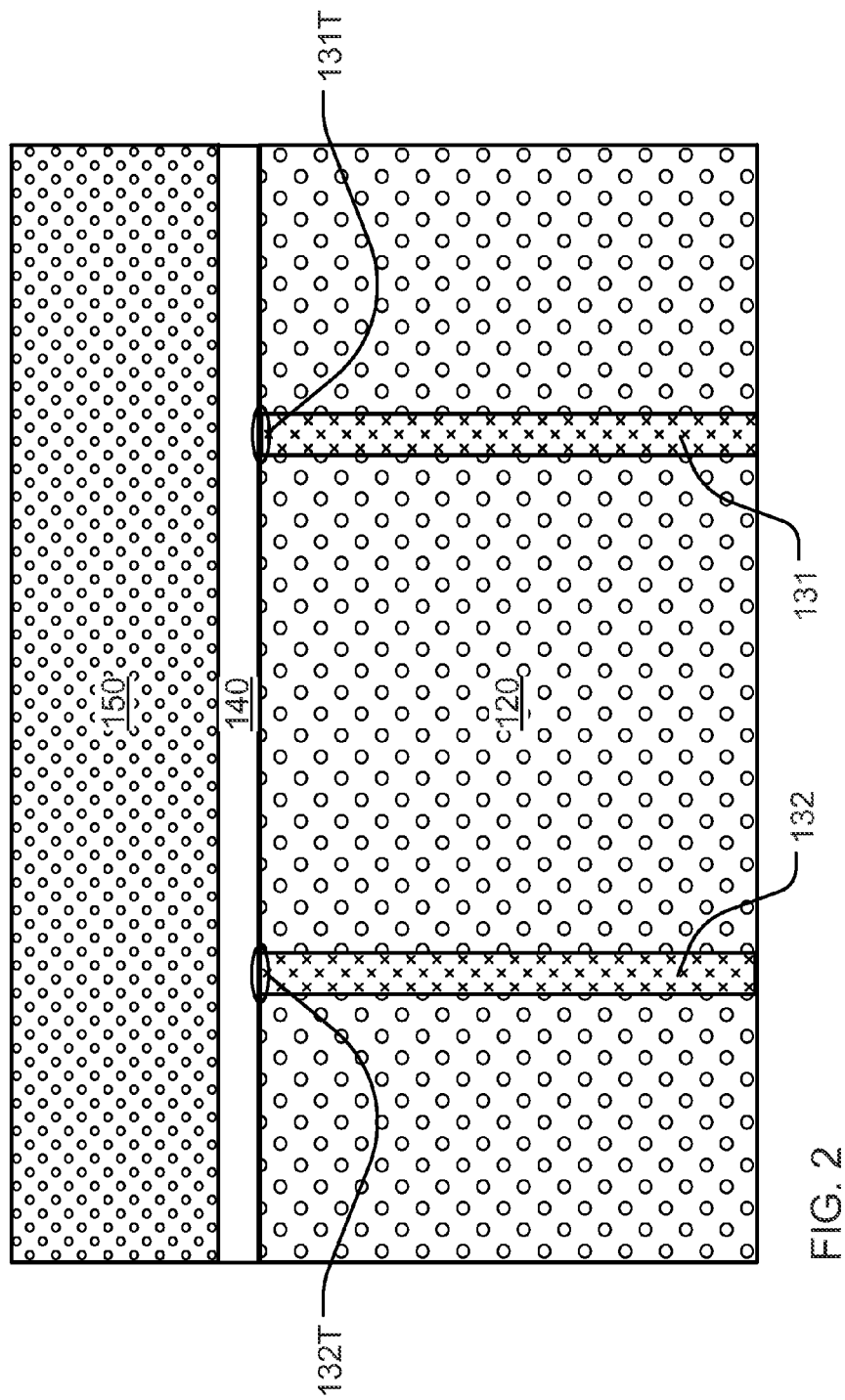
FIGS. 2 through 8 illustrate example steps in manufacturing a memory cell as shown in FIG. 1.

FIGS. 2 through 8 illustrate example steps in manufacturing a memory cell as shown in FIG. 1. FIG. 2 illustrates results of forming a dielectric layer (e.g. 120), forming an array of interlayer conductors including first and second interlayer conductors (e.g. 131, 132) extending through the dielectric layer, and forming an insulating layer (e.g. 150) over the array of interlayer conductors, in a cross-sectional view. In embodiments, a diffusion barrier layer (e.g. 140) can be formed between the insulating layer and the dielectric layer, and contacting top surfaces (e.g. 131T, 132T) of the array of interlayer connectors, to stop etching of the first opening and the second opening at top surfaces of the array of interlayer conductors, and to protect the top surfaces of the interlayer conductors from oxidation. The dielectric layer can include silicon dioxide. The insulating layer will be patterned for forming top electrodes of memory cells. The first and second interlayer conductors are connected to first and second terminals of an access device (e.g. 111, 112, FIG. 1), at a side of the dielectric layer opposite the insulating layer.

Figure 3:
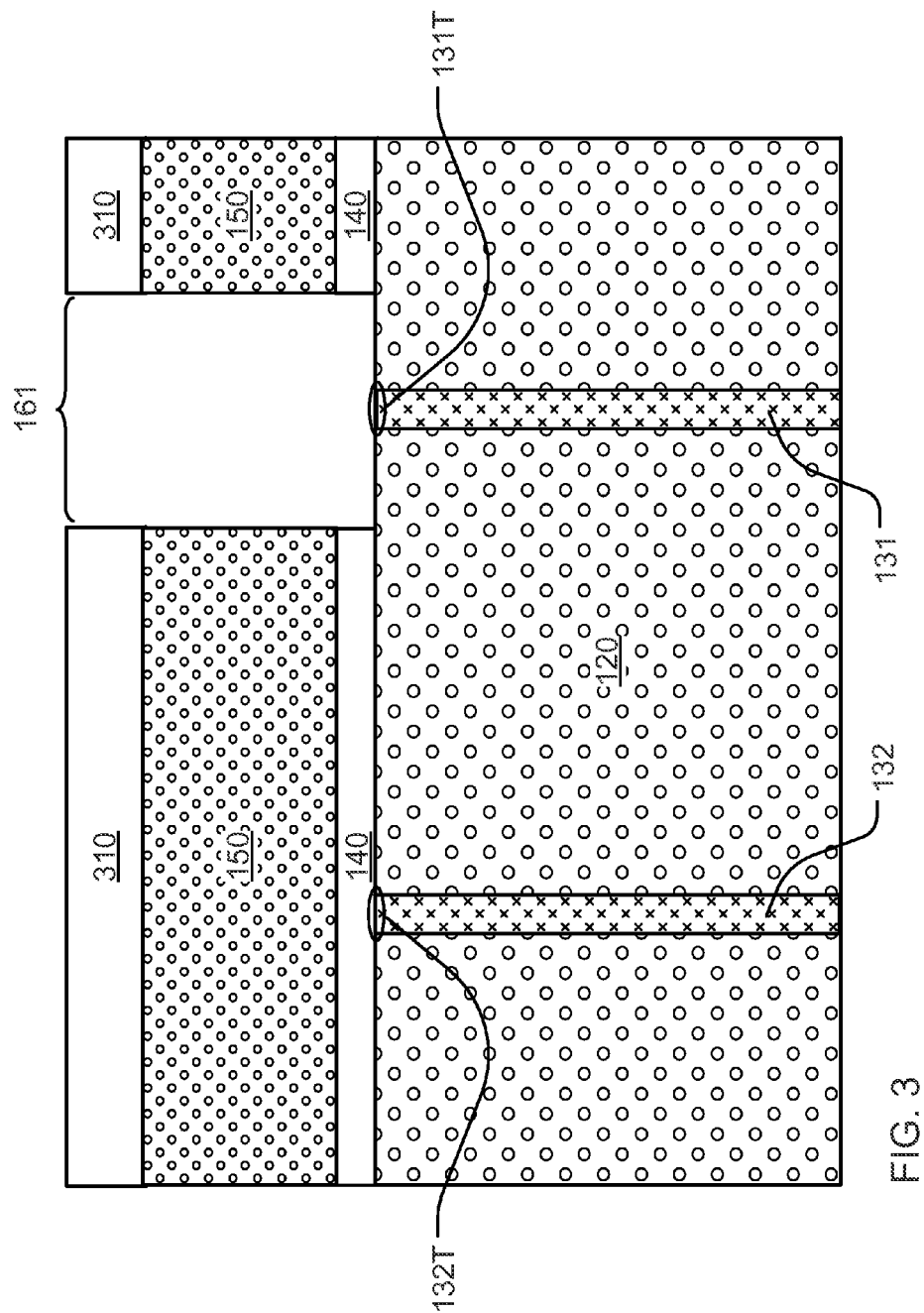

FIG. 3 illustrates results of etching the insulating layer to define a first opening (e.g. 161) corresponding to the first interlayer conductor (e.g. 131) in the array, where the etching stops at the first top surface (e.g. 131T) of the first interlayer conductor. In embodiments where the diffusion barrier layer is formed, the etching to define the first opening also etches through the diffusion barrier layer and stops at top surfaces of the first interlayer conductor in the first opening. At this manufacturing step, an opening corresponding to the second interlayer conductor in the array of interlayer conductor is not present in the insulating layer. For instance, when etching to define the first opening, a first etch mask (e.g. 310), such as a photoresist mask, can be used over the insulating layer, where the first etch mask has a mask region corresponding to the second interlayer conductor and a spaced apart region corresponding to the first opening (e.g. 161).

Figure 4:
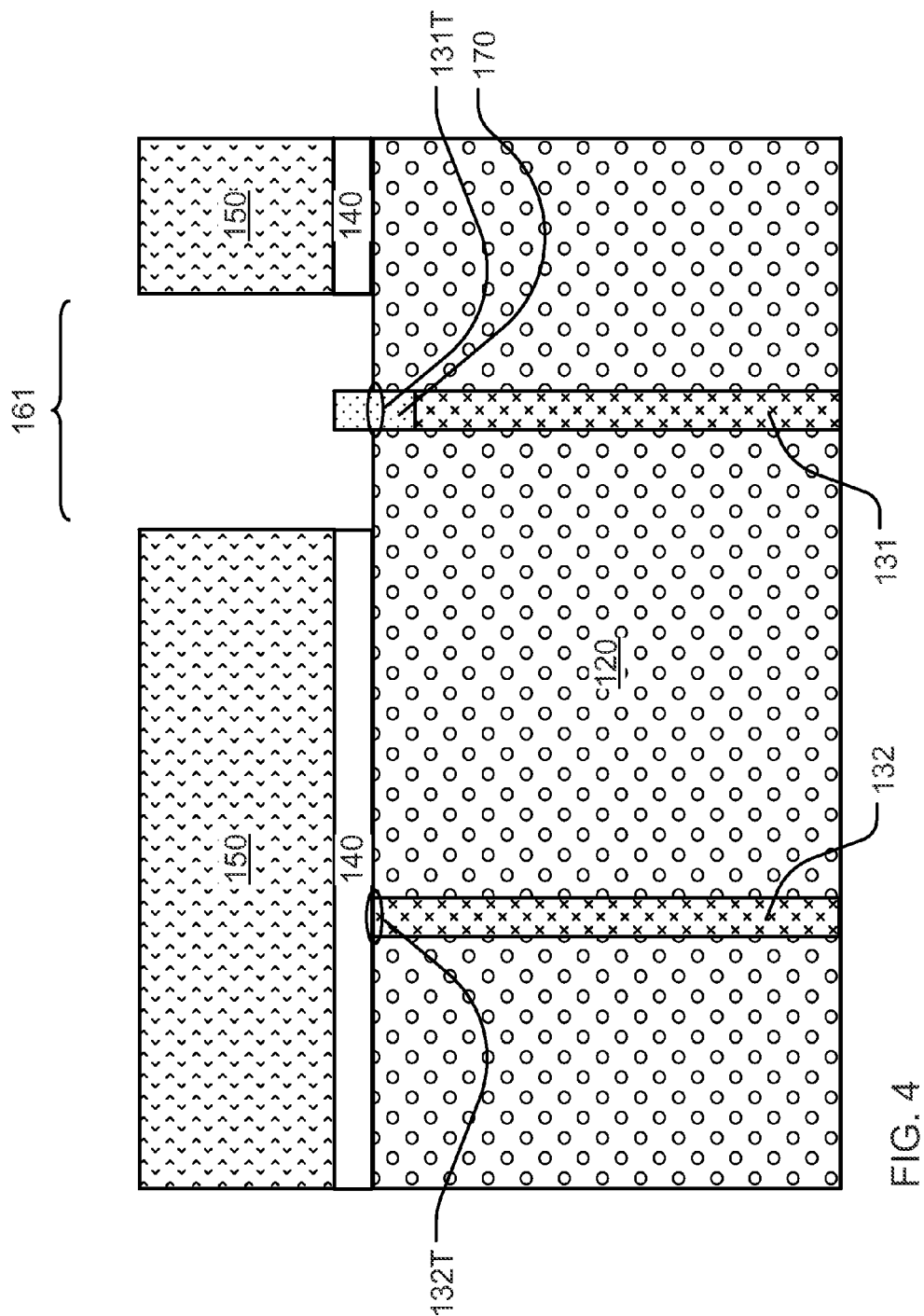

FIG. 4 illustrates results of forming a metal oxide layer on the first top surface (e.g. 131T) of the first interlayer conductor in the first opening. The metal oxide layer may be formed using various deposition and oxidation techniques, such as rapid thermal oxidation (RTO), photo-oxidation, direct plasma oxidation, down-stream plasma oxidation, sputtering, and reactive sputtering. For example, to oxidize W (tungsten) or Cu (copper) using RTO, the temperature can be from 200 C to 1100 C in $O_2$ or $O_2/N_2$ ambient, and the process time can be from 5 seconds to 500 seconds, typically 30 seconds to 60 seconds. In embodiments where the first interlayer conductor includes W (tungsten), plasma oxidation can result in a graded $W_xO_y$ having concentrations of tungsten-oxygen compounds that have a distribution that varies with distance from the surface exposed to oxidation. For instance, the metal oxide layer (e.g. 170) can have a graded profile including $WO_3$, $W_2O_5$ and $WO_2$ such that the oxygen ratio in the metal oxide layer decreases in a direction from the first opening (e.g. 161) towards the first interlayer conductor (e.g. 131). The metal oxide layer can extrude from the first top surface of the first interlayer conductor into the first opening due to volume expansion during forming the metal oxide layer.

In one implementation when the RTO oxidation technique is used, the metal oxide layer can have a thickness of about 50 nm (nanometer) within a range between 1 nm and 300 nm. In another implementation when the plasma oxidation technique is used, the metal oxide layer can have a thickness of about 5 nm within a range of between 1 nm and 50 nm.

Figure 5:
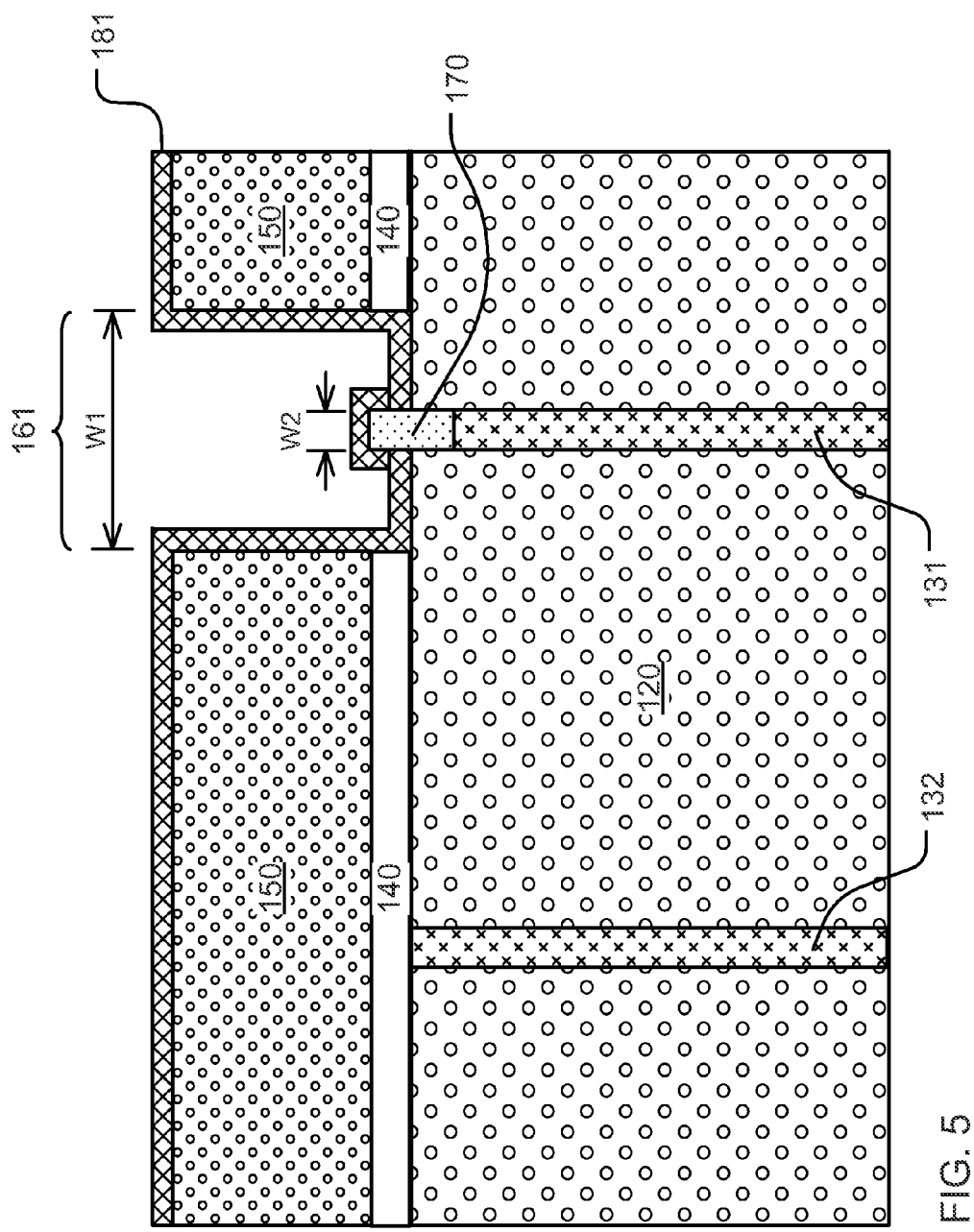

FIG. 5 illustrates results of depositing a first layer of barrier material (e.g. 181) in the first opening (e.g. 161), where the first layer of barrier material is conformal with and contacting the metal oxide layer on the first top surface of the first interlayer conductor, and conformal with and contacting side and bottom surfaces of the first opening. In one embodiment, the first layer of barrier material (e.g. 181) can have a thickness of about 10 nm (nanometer) within a range of 1 nm and 50 nm. The first layer of barrier material (e.g. 181) can comprise one or more layers of different materials comprised of one or more elements selected from the group consisting of Ti, TiN, W, AlCu, TaN, Cu, Hf, Ta, Au, Pt, Ag, and other metals which are CMOS compatible and do not alter the variable resistance properties of the metal oxide layer. The first layer of barrier material can protect the metal oxide layer from potential damage by subsequent manufacturing steps to form and then remove etch masks over the metal oxide layer, thus providing better interface between the metal oxide layer and the top electrode.

A minimum width of the first opening depends on the manufacturing technology. The first opening (e.g. 161) can have a width (e.g. W1) greater than a width (e.g. W2) of the first interlayer conductor (e.g. 131). For instance, if the first interlayer conductor includes W (tungsten) and has a width of about 100 nm, then the first opening can have a width greater than 120 nm.

Figure 6:
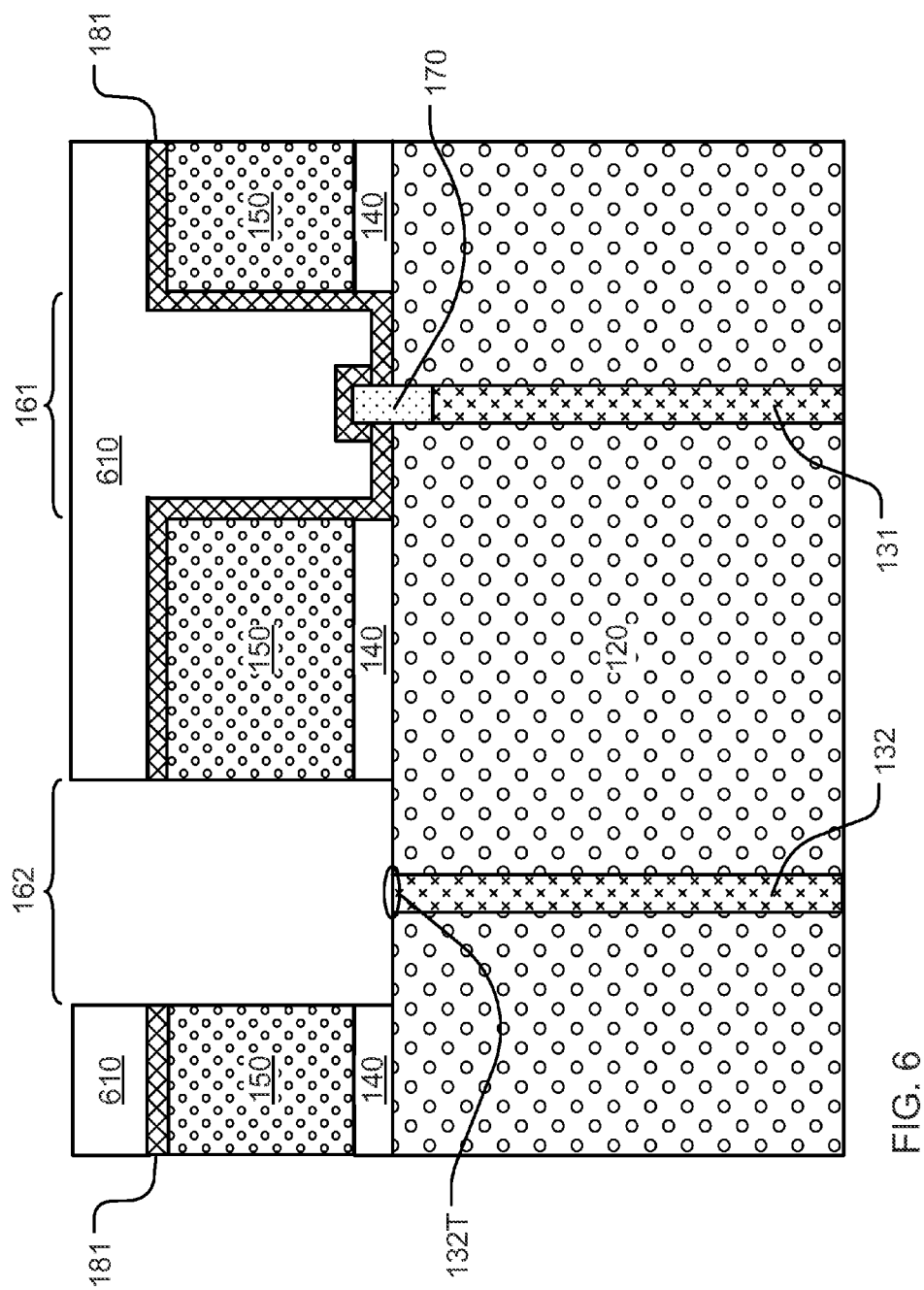

FIG. 6 illustrates results of etching the insulating layer (e.g. 150) to define a second opening (e.g. 162) corresponding to the second interlayer conductor (e.g. 132) in the array of interlayer conductors, where the etching stops at the second top surface (e.g. 132T) of the second interlayer conductor. This etching step to define the second opening is subsequent to depositing the first layer of barrier material as shown in FIG. 5, and etches through the first layer of barrier material (e.g. 181). In embodiments where the diffusion barrier layer is formed, the etching to define the second opening also etches through the diffusion barrier layer and stops at top surfaces of the second interlayer conductor in the second opening. In one implementation, the second opening (e.g. 162) can have a width matching the width of the first opening (e.g. 161).

In prior methods where a layer comprised of a metal oxide is formed on the second top surface of the second interlayer conductor, the layer comprised of a metal oxide needs to be removed by processes such as sputtering, and thus may cause contamination to side walls of the second opening in the insulating layer. For instance, if the second interlayer conductor includes copper (Cu) and the metal oxide layer includes a copper oxide (CuOx), copper may be sputtered onto side walls of the second opening while the metal oxide layer is removed.

In embodiments of the present technology, since a layer comprised of a metal oxide is not present on the second top surface (e.g. 132T) of the second interlayer conductor (e.g. 132) and the etching stops at the second top surface (e.g. 132T) of the second interlayer conductor (e.g. 132), such contamination to side walls of the second opening in the insulating layer as may happen with the prior methods can be minimized.

At this manufacturing step to define the second opening, a second etch mask (e.g. 610), such as a photoresist mask, can be used over the insulating layer (e.g. 150) and the first layer of barrier material (e.g. 181), where the second etch mask has a mask region corresponding to the first opening (e.g. 161) and a spaced apart region corresponding to the second opening (e.g. 162). Therefore the metal oxide layer (e.g. 170) in the first opening is protected by the first layer of barrier material and the mask region in the second etch mask at this manufacturing step.

Figure 7:
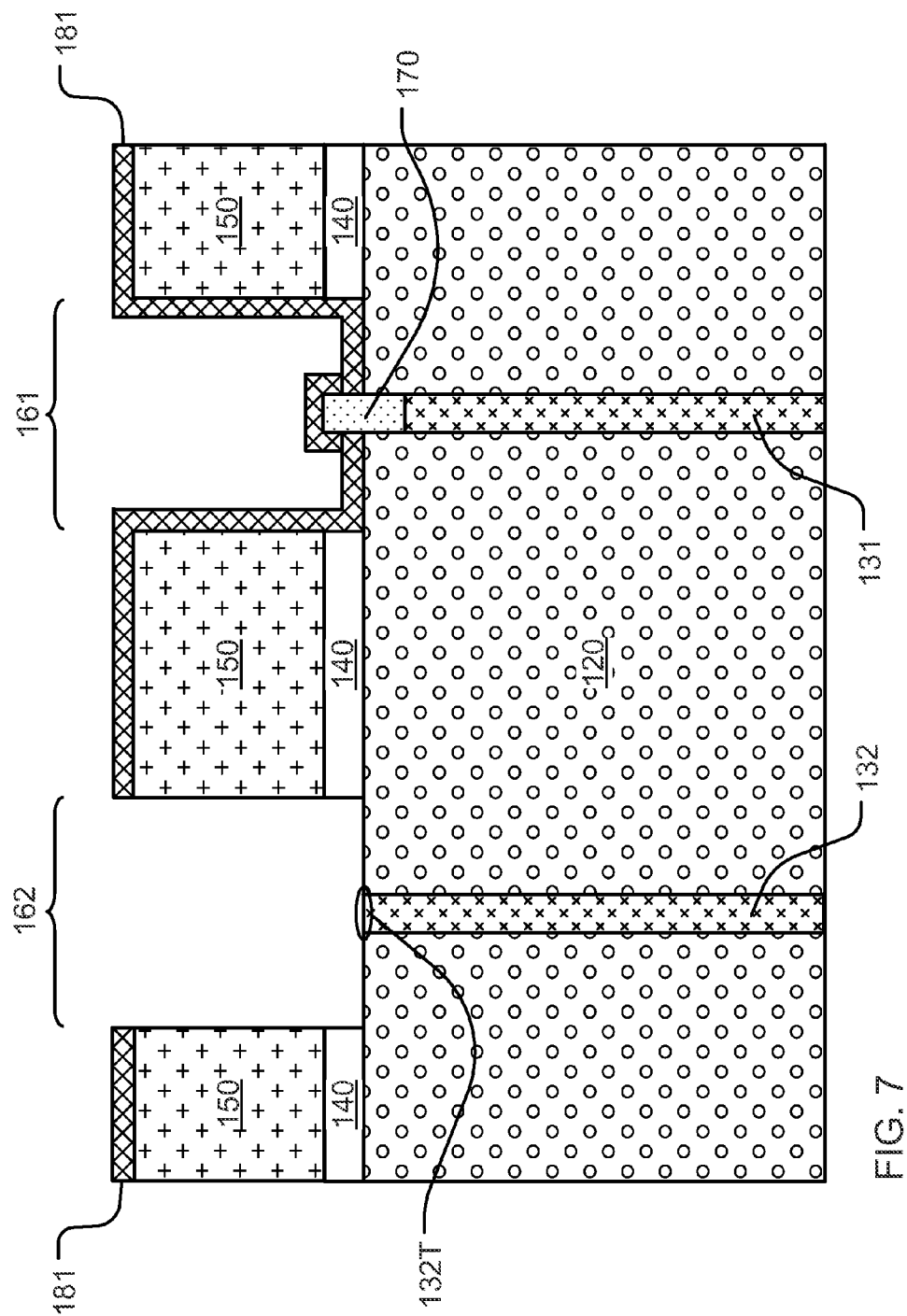

FIG. 7 illustrates results of stripping the second etch mask (e.g. 610) as shown in FIG. 6, after the second opening (e.g. 162) is defined using the second etch mask. During the stripping, the metal oxide layer (e.g. 170) in the first opening is protected by the first layer of barrier material (e.g. 181).

In preparation for depositing a second layer of barrier material, plasma cleaning can be used to remove impurities, contaminants, and native oxide from the second top surface (e.g. 132T) of the second interlayer conductor, through use of an energetic plasma created from gaseous species. For instance the gaseous species can include argon, and the plasma cleaning can etch a depth from about 1 nm to 20 nm. During the plasma cleaning, the metal oxide layer (e.g. 170) in the first opening is protected by the first layer of barrier material (e.g. 181).

Figure 8:
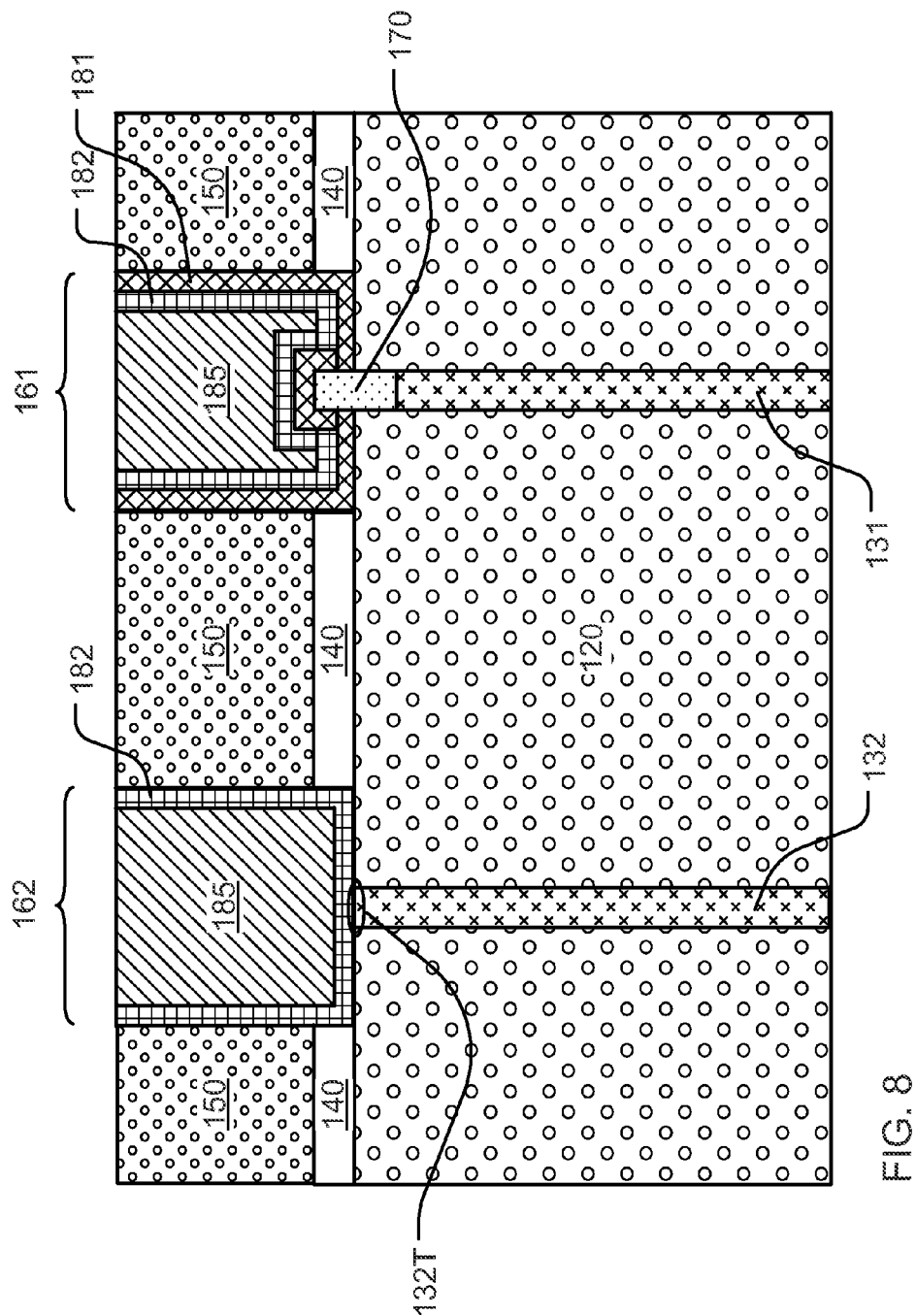

FIG. 8 illustrates results of depositing a second layer of barrier material (e.g. 182) in the first opening and the second opening. The second layer of barrier material is conformal with and contacting the first layer of barrier material (e.g. 181) in the first opening, and conformal with and contacting the second top surface (e.g. 132T) of the second interlayer conductor in the second opening and side and bottom surfaces of the second opening. In one embodiment, the second layer of barrier material (e.g. 182) can have a thickness of about 10 nm (nanometer) within a range of 1 nm and 50 nm. The first layer of barrier material (e.g. 181) and the second layer of barrier material (e.g. 182) can comprise one or more layers of different materials comprised of one or more elements selected from the group consisting of Ti, TiN, W, AlCu, TaN, Cu, Hf, Ta, Au, Pt, Ag, and other metals which are CMOS compatible and do not alter the variable resistance properties of the metal oxide layer.

A conductive material (e.g. 185) can be subsequently filled in the first opening and the second opening. A first access line (not shown) electrically connected to the metal oxide layer can be formed, for example via the conductive material filled in the first opening, and can act as a bit line for the memory cell. A second access line (not shown) electrically connected to the second interlayer conductor can be formed, for example via the conductive material filled in the second opening, and can act as a source line for the memory cell. The conductive material (e.g. 185) filled in the first opening (e.g. 161) and the second opening (e.g. 162) can be formed at metal layer 1 (ML1), while the first and second access lines can be formed at metal levels 2, 3, 4 or n (ML2, ML3, ML4, or . . . MLn). Furthermore, the first and second access lines can be formed at different metal levels. For example, the first access line can be formed at metal layer 3 (ML3), while the second access line can be formed at metal layer 4 (ML4).

Figure 9:
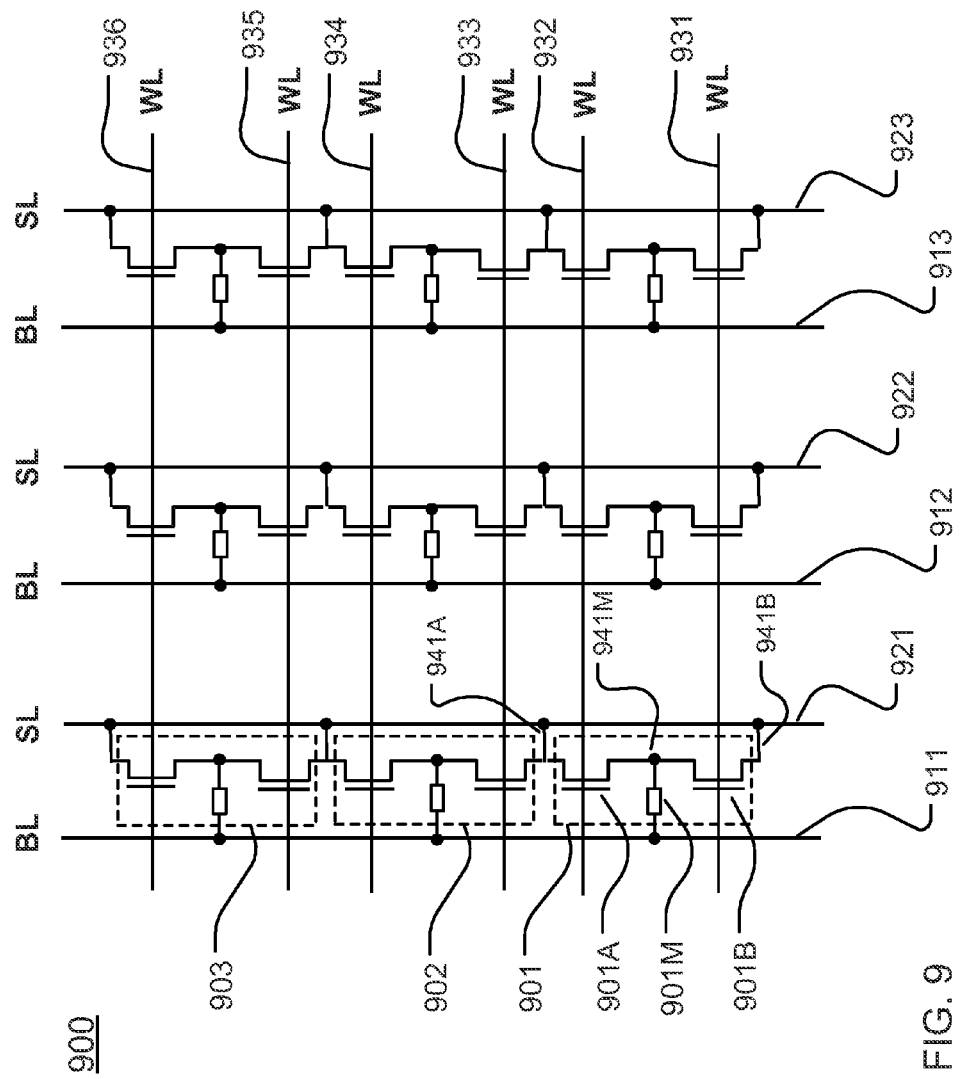
FIG. 9 shows a circuit diagram of a RRAM (Resistive random access memory) array in accordance with an embodiment.

FIG. 9 shows a circuit diagram of a RRAM (Resistive random access memory) array in accordance with an embodiment. A RRAM array 900 includes rows and columns of memory cells (e.g. 901, 902 and 903), where each memory cell includes a first transistor, a second transistor and a memory element (e.g. 901A, 901B and 901M) connected to a bit line. The first and second transistors can be NMOS (N-type metal oxide semiconductor) transistors. The memory element can include the metal oxide layer 170 as shown in FIG. 8. The memory cell can include the first layer of barrier material 181 and the second layer of barrier material 182 above the metal oxide layer 170 as shown in FIG. 1. First terminals of the first and second transistors in a memory cell are connected to one end of the memory element in the memory cell. The three memory cells 901, 902 and 903 shown represent a small section of a memory array that can include thousands or millions of memory cells.

A plurality of first access lines (e.g. 911, 912 and 913) extends in a first direction and is in electrical communication with a bit line decoder (not shown) and the memory elements of the memory cells. A memory element in a memory cell is connected to a first access line in the plurality of first access lines at one end, and connected to first terminals of the first and second transistors in the memory cell at another end, via a first interlayer conductor (e.g. 941M) disposed below the memory element (e.g. 901M). A cross-sectional view of a first interlayer conductor is shown in FIG. 8 (e.g. 131). The plurality of first access lines can act as bit lines.

A plurality of second access lines (e.g. 921, 922 and 923) extends in the first direction, and terminates at a source line termination circuit (not shown). A second access line (e.g. 921) is in electrical communication with second terminals of the first and second transistors (e.g. 901A and 901B) in a memory cell, via second interlayer conductors (e.g. 941A and 941B). A cross-sectional view of a second interlayer conductor is shown in FIG. 8 (e.g. 132). The plurality of second access lines can act as source lines.

A plurality of third access lines (e.g. 931-936) extends in a second direction orthogonal to the first direction. The third access lines are in electrical communication with a word line decoder (not shown), and can act as word lines. Gate terminals of the first and second transistors (e.g. 901A and 901B) in the memory cells are connected to respective third access lines. The bit line decoder and the word line decoder can include CMOS (complementary metal oxide semiconductor) circuitry.

Figure 10:
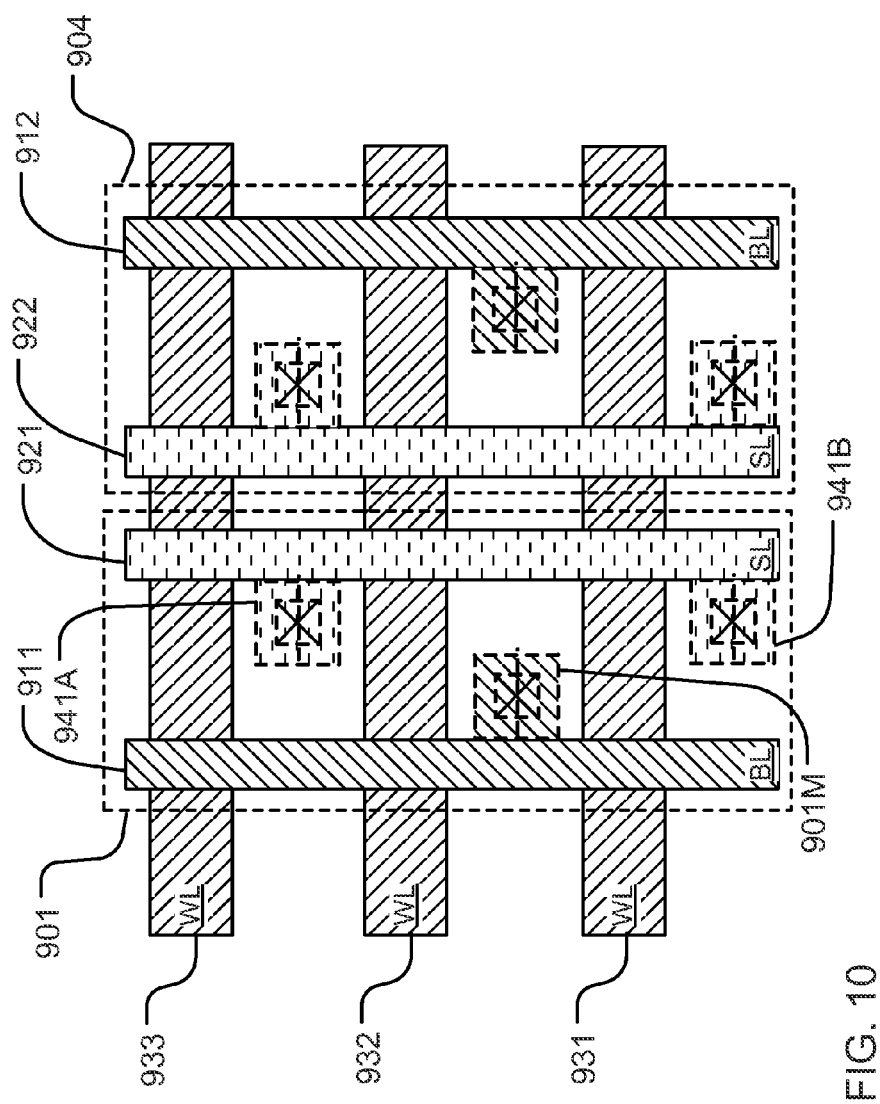
FIG. 10 illustrates a simplified layout diagram of memory cells in accordance with the embodiment shown in FIG. 9.

FIG. 10 illustrates a simplified layout diagram of memory cells in accordance with the embodiment shown in FIG. 9. Like elements in FIG. 10 are referred to with like reference numerals in FIG. 9. The layout of the memory cells can be repeated in vertical and horizontal directions. For clarity, the insulation material is not shown, for example between the first, second and third access lines.

The layout diagram illustrates first access lines 911 and 912 acting as bit lines (BL), second access lines 921 and 922 acting as source lines (SL), and third access lines 931, 932 and 933 acting as word lines (WL). In one implementation, the first access lines and the second access lines can be disposed in a metal layer 1. The first, second and third access lines are connected to memory cells (e.g. 901 and 904), as described in connection with FIG. 9. The memory cells include memory elements (e.g. 901M) that can include the metal oxide layer 170 as shown in FIG. 8. The memory cells can include the first layer of barrier material 181, and the second layer of barrier material 182 above the metal oxide layer as shown in FIG. 1.

Figure 11:
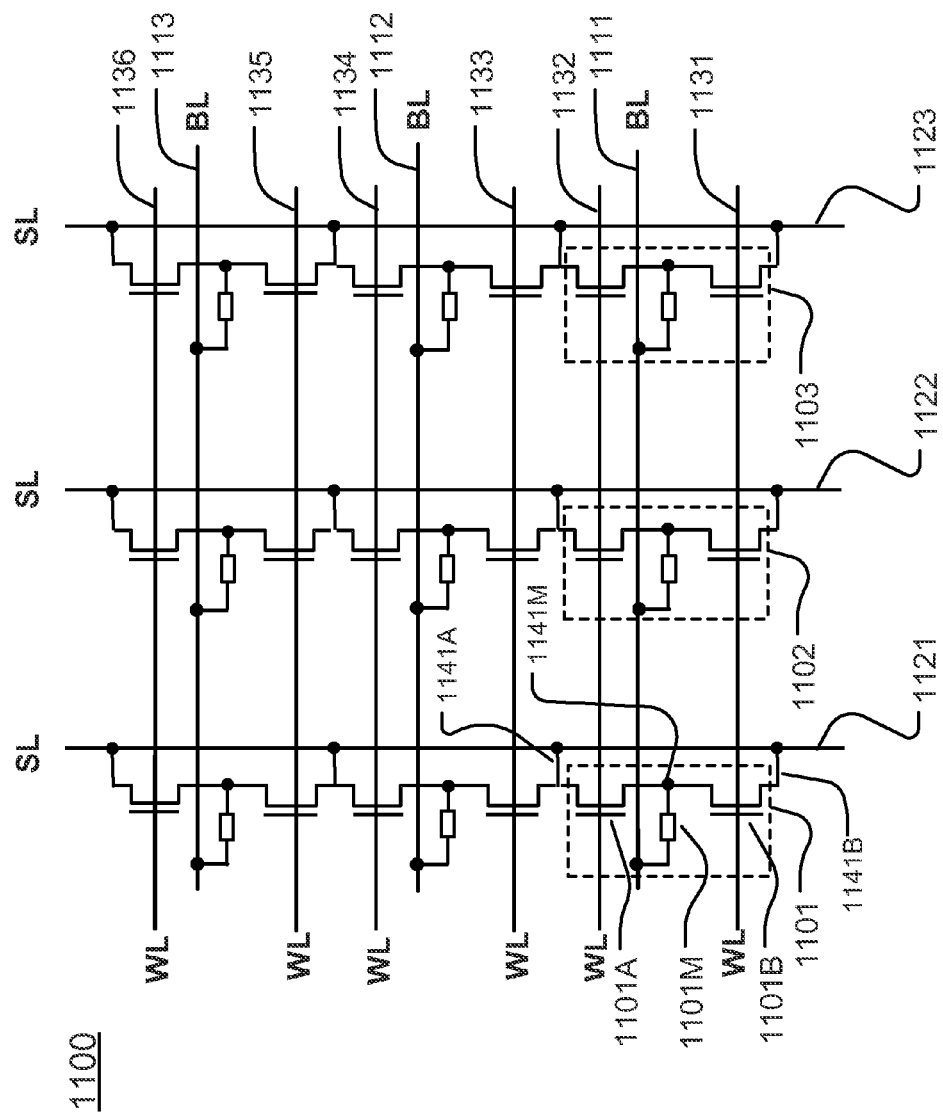
FIG. 11 shows a circuit diagram of a RRAM array in accordance with a second embodiment.

FIG. 11 shows a circuit diagram of a RRAM (Resistive random access memory) array in accordance with a second embodiment. A RRAM array 1100 includes rows and columns of memory cells (e.g. 1101, 1102 and 1103), where each memory cell includes a first transistor, a second transistor and a memory element (e.g. 1101A, 1101B and 1101M). The first and second transistors can be NMOS (N-type metal oxide semiconductor) transistors. The memory cell can include the first layer of barrier material 181 and the second layer of barrier material 182 above the memory element as shown in FIG. 1. The memory element can include the metal oxide layer 170 as shown in FIG. 8. First terminals of the first and second transistors in a memory cell are connected to one end of the memory element in the memory cell, while second terminals of the first and second transistors in the memory cell are connected to a source line (e.g. 1121). The three memory cells 1101, 1102 and 1103 shown represent a small section of a memory array that can include thousands or millions of memory cells.

A plurality of first access lines (e.g. 1111, 1112 and 1113) extends in a first direction, and is in electrical communication with a bit line decoder (not shown). The plurality of first access lines can act as bit lines. A plurality of second access lines (e.g. 1121, 1122 and 1123) extends in a second direction orthogonal to the first direction, and terminates at a source line termination circuit (not shown). The plurality of second access lines can act as source lines.

The memory cells include first interlayer conductors (e.g. 1141M) disposed below the memory element (e.g. 1101M) connecting the memory element (e.g. 1101M) to first terminals of the first and second transistors (e.g. 1101A and 1101B), and second interlayer conductors (e.g. 1141A and 1141B) connecting second terminals of the first and second transistors to source lines (e.g. 1121). A cross-sectional view of a first interlayer conductor and a second interlayer conductor is shown in FIG. 8 (e.g. 131 and 132).

A plurality of third access lines (e.g. 1131-1136) extends in the first direction. The third access lines are in electrical communication with a word line decoder (not shown), and can act as word lines. Gate terminals of the first and second transistors (e.g. 1101A and 1101B) in the memory cells are connected to respective third access lines. The bit line decoder and the word line decoder can include CMOS (complementary metal oxide semiconductor) circuitry.

Figure 12:
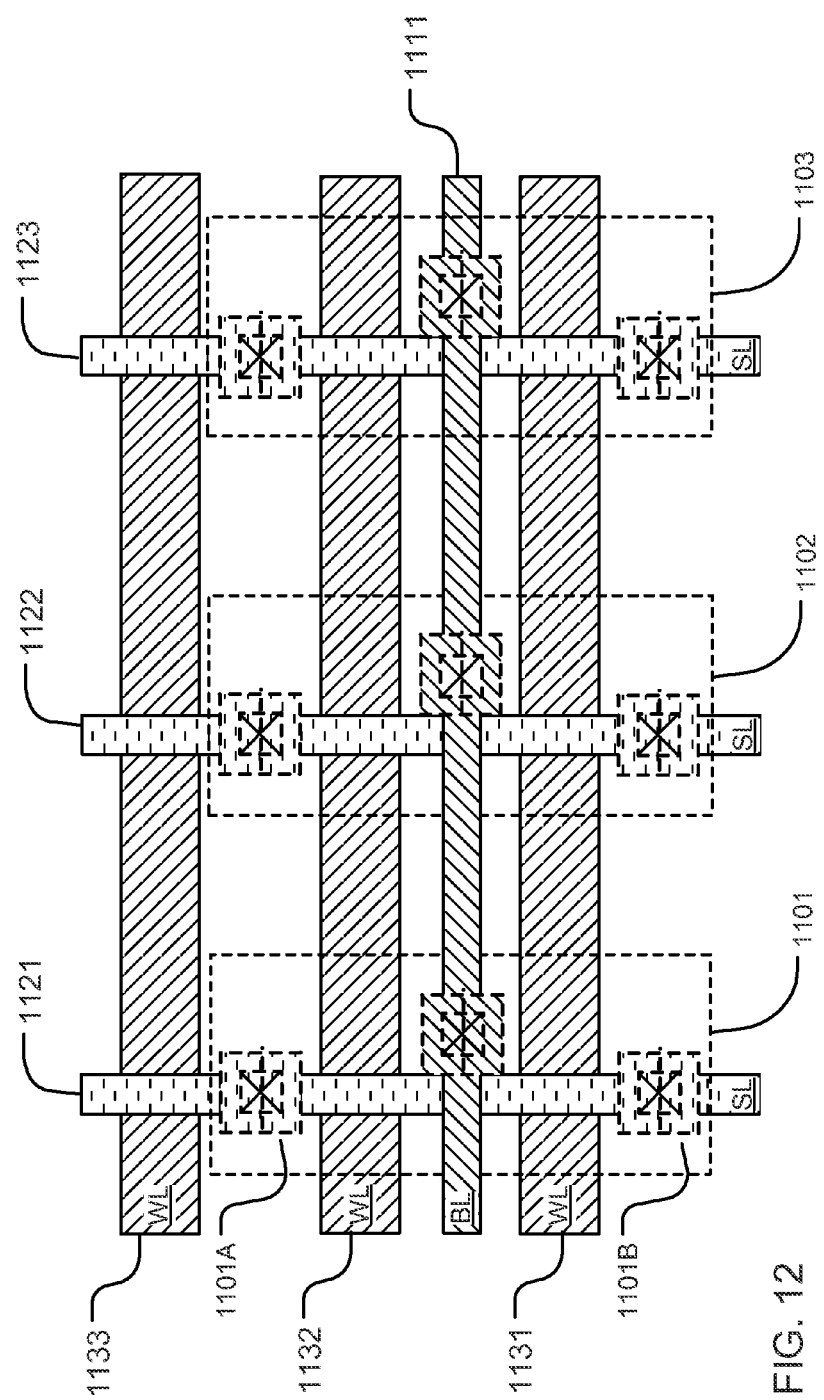
FIG. 12 illustrates a simplified layout diagram of memory cells in accordance with the second embodiment shown in FIG. 11.

FIG. 12 illustrates a simplified layout diagram of memory cells in accordance with the second embodiment shown in FIG. 11. Like elements in FIG. 12 are referred to with like reference numerals in FIG. 11. The layout of the memory cells can be repeated in vertical and horizontal directions. For clarity, the insulation material is not shown, for example between the first, second and third access lines.

The layout diagram illustrates first access lines (e.g. 1111) acting as bit lines (BL), second access lines (e.g. 1121, 1122 and 1123) acting as source lines (SL), and third access lines (e.g. 1131, 1132 and 1133) acting as word lines (WL). In one implementation, the second access lines can be disposed in a metal layer 1, and the first access lines can be disposed in a metal layer 2 above the metal layer 1. The first, second and third access lines are connected to memory cells (e.g. 1101, 1102 and 1103), as described in connection with FIG. 11. The memory cells include memory elements (e.g. 1101M) that can include the metal oxide layer 170 as shown in FIG. 8. The memory cells include the first layer of barrier material 181, and the second layer of barrier material 182 above the metal oxide layer as shown in FIG. 1.

Figure 13:
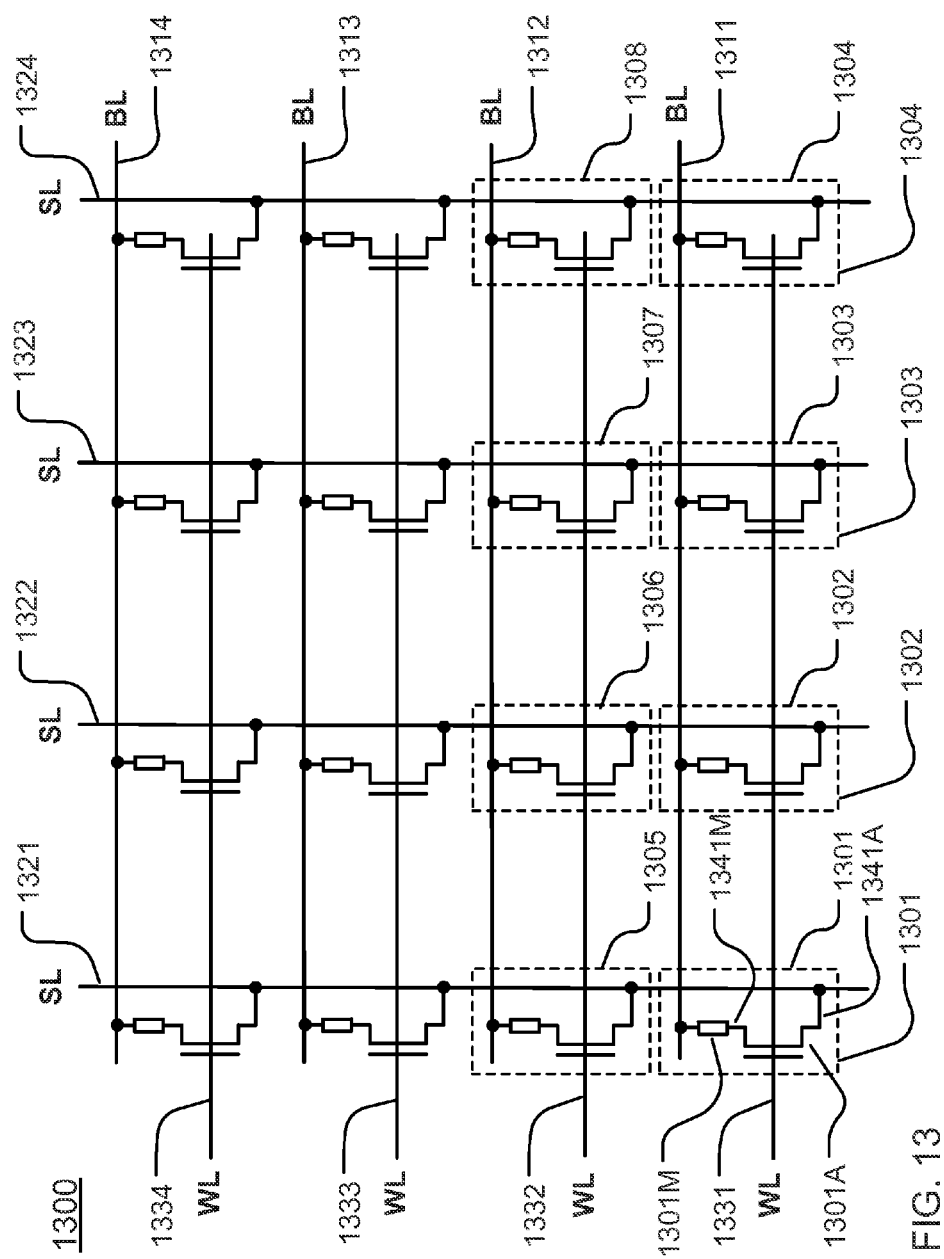
FIG. 13 shows a circuit diagram of a RRAM array in accordance with a third embodiment.

FIG. 13 shows a circuit diagram of a RRAM (Resistive random access memory) array in accordance with a third embodiment. A RRAM array 1300 includes rows and columns of memory cells (e.g. 1301, 1302, 1303, 1304, 1305, 1306, 1307 and 1308), where each memory cells includes a transistor and a memory element (e.g. 1301A and 1301M). The transistor can be an NMOS (N-type metal oxide semiconductor) transistor. The memory element can include the metal oxide layer 170 in the memory cell as shown in FIG. 8. The memory cell can include the first layer of barrier material 181 and the second layer of barrier material 182 above the metal oxide layer 170 as shown in FIG. 1. A first terminal of the transistor in a memory cell is connected to one end of the memory element in the memory cell. The memory cells shown represent a small section of a memory array that can include thousands or millions of memory cells.

A plurality of first access lines (e.g. 1311, 1312, 1313 and 1314) extends in a first direction, is in electrical communication with a bit line decoder (not shown), and is connected to a second end of the memory element opposite the end connected to the first terminal of the transistor in the memory cell.

The plurality of first access lines can act as bit lines. The memory cells can include first interlayer conductors (e.g. 1341M) disposed below the memory element (e.g. 1301M) connecting the memory element to first terminals of the transistors (e.g. 1301A). A cross-sectional view of a first interlayer conductor is shown in FIG. 8 (e.g. 131).

A plurality of second access lines (e.g. 1321, 1322, 1323 and 1324) extends in a second direction orthogonal to the first direction, and terminates at a source line termination circuit (not shown). The plurality of second access lines can act as source lines. The memory cells can include second interlayer conductors (e.g. 1341) connecting second terminals of the transistors to source lines (e.g. 1321). A cross-sectional view of a second interlayer conductor is shown in FIG. 8 (e.g. 132).

A plurality of third access lines (e.g. 1331-1334) extends in the first direction. The third access lines are in electrical communication with a word line decoder (not shown), and can act as word lines. Gate terminals of the transistors (e.g. 1301A) in the memory cells are connected to respective third access lines. The bit line decoder and the word line decoder can include CMOS (complementary metal oxide semiconductor) circuitry.

Figure 14:
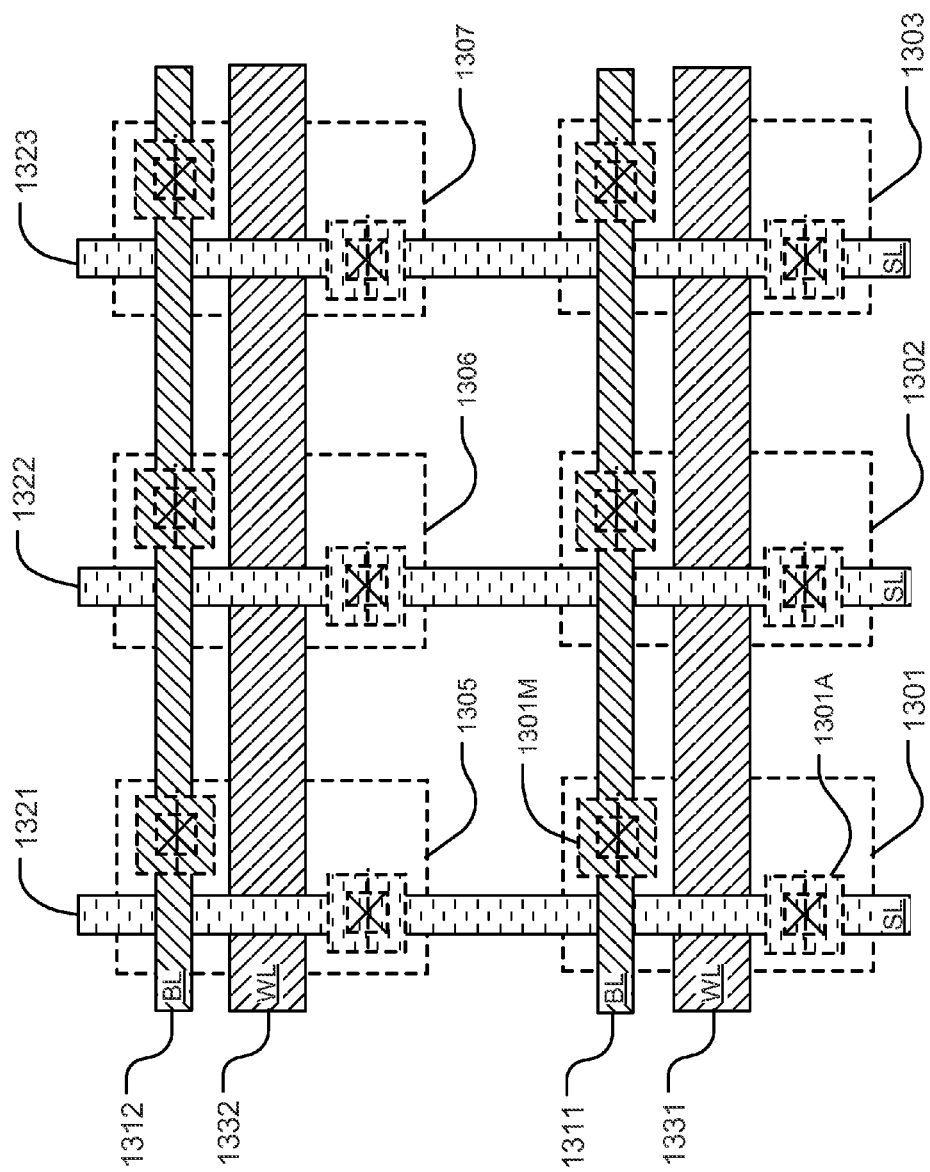
FIG. 14 illustrates a simplified layout diagram of memory cells in accordance with the third embodiment shown in FIG. 13.

FIG. 14 illustrates a simplified layout diagram of memory cells in accordance with the third embodiment shown in FIG. 13. Like elements in FIG. 14 are referred to with like reference numerals in FIG. 13. The layout of the memory cells can be repeated in vertical and horizontal directions. For clarity, the insulation material is not shown, for example between the first, second and third access lines.

The layout diagram illustrates first access lines 1311 and 1312 acting as bit lines (BL), second access lines 1321, 1322 and 1323 acting as source lines (SL), and third access lines 1331 and 1332 acting as word lines (WL). In one implementation, the second access lines can be disposed in a metal layer 1, and the first access lines can be disposed in a metal layer 2 above the metal layer 1. The first, second and third access lines are connected to memory cells (e.g. 1301-1303 and 1305-1306), as described in connection with FIG. 13. The memory cells include memory elements (e.g. 1301M) that can include the metal oxide layer 170 as shown in FIG. 8. The memory cells include the first layer of barrier material 181, and the second layer of barrier material 182 above the metal oxide layer as shown in FIG. 1.

Figure 15:
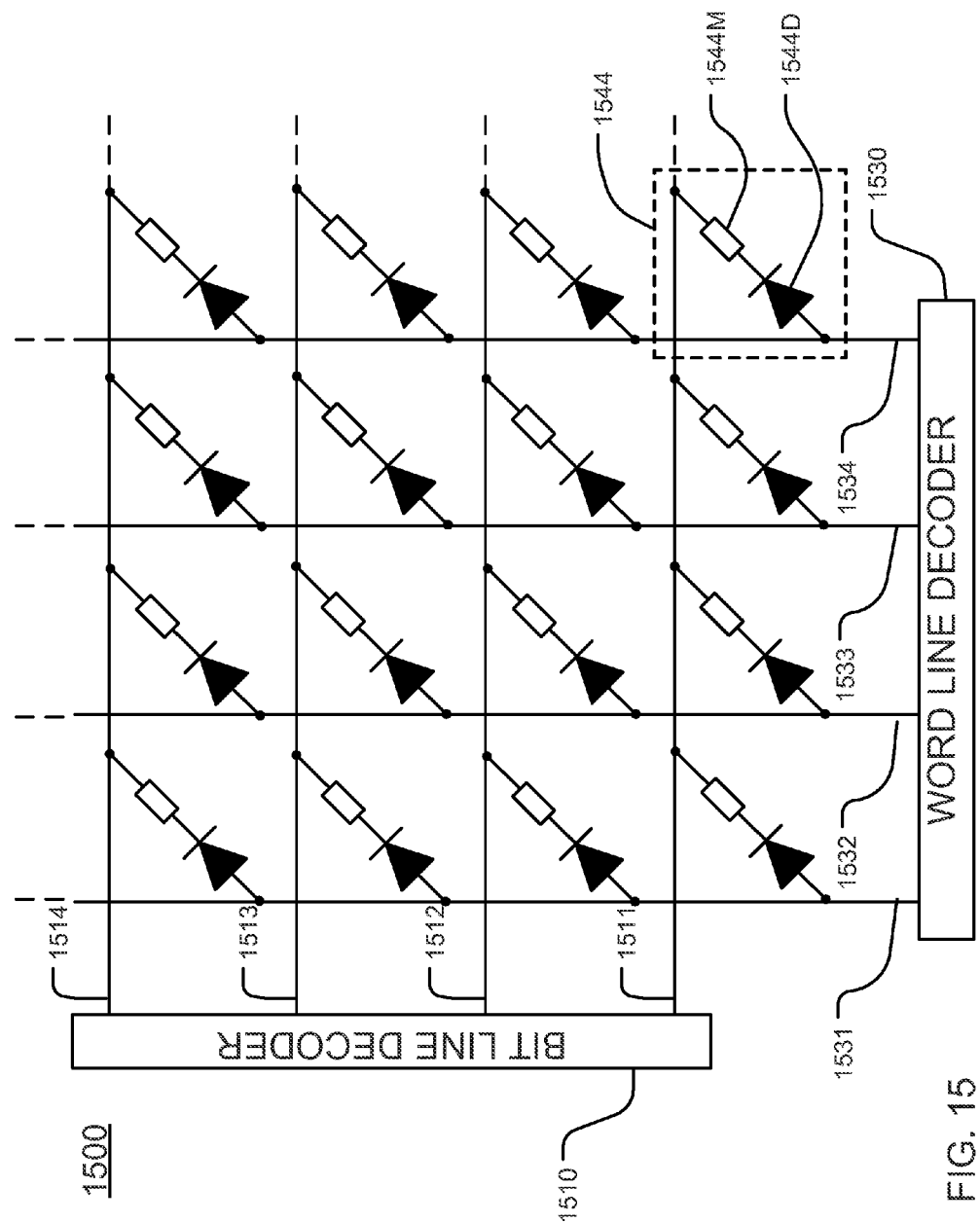
FIG. 15 shows a circuit diagram of a RRAM array in accordance with an embodiment using diodes as access devices.

FIG. 15 shows a circuit diagram of a RRAM array in accordance with an embodiment using diodes as access devices. The memory array 1500 includes a matrix of memory cells, a plurality of word lines (e.g. 1531, 1532, 1533 and 1534) and a plurality of bit lines (e.g. 1511, 1512, 1513 and 1514). Each of the memory cells (e.g. 1544) in the example memory array 1500 includes an access diode (e.g. 1544D) and a memory element (e.g. 1544M) in series between a corresponding word line (e.g. 1534) and a corresponding bit line (e.g. 1511). Each memory element is electrically coupled to a corresponding access diode.

A memory cell in the memory array 1500 can include the first layer of barrier material 181 and the second layer of barrier material 182 above the memory element as shown in FIG. 1. The memory element in the memory cell includes the metal oxide layer 170 in the memory cell as shown in FIG. 8.

The plurality of bit lines including bit lines 1511, 1512, 1513 and 1514 extends in parallel along a first direction. The bit lines are in electrical communication with a bit line decoder 1510. Memory elements can be connected between anodes or cathodes of diodes and bit lines. For example, the memory element 1544M is connected between the cathode of diode 1544D and the bit line 1511. The plurality of word lines including word lines 1531, 1532, 1533 and 1534 extend in parallel along a second direction. The word lines 1531, 1532, 1533 and 1534 are in electrical communication with a word line decoder 1530. Cathodes or anodes of diodes may be connected to word lines. For example, the anode of diode 1544D is connected to a word line 1534. The bit line decoder and the word line decoder can include CMOS (complementary metal oxide semiconductor) circuitry. It should be noted that the sixteen memory cells in FIG. 15 are shown for convenience of discussion but, in practice, a memory array may comprise thousands or millions of such memory cells.

Figure 16:
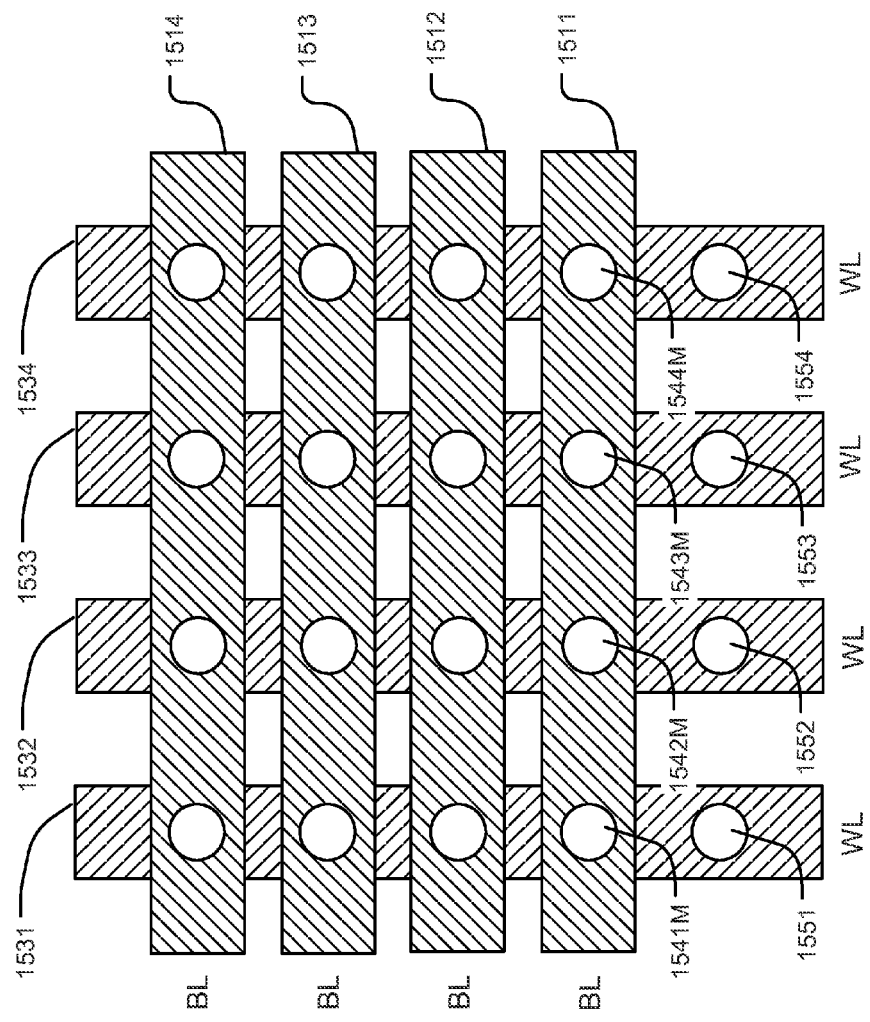
FIG. 16 illustrates a simplified layout diagram of memory cells in accordance with the embodiment using diodes as access devices shown in FIG. 15.

FIG. 16 illustrates a simplified layout diagram of memory cells in accordance with the embodiment using diodes as access devices shown in FIG. 15. Like elements in FIG. 16 are referred to with like reference numerals in FIG. 15. The layout of the memory cells can be repeated in vertical and horizontal directions. For clarity, the insulation material is not shown, for example between the first and second access lines.

The layout diagram illustrates first access lines 1511, 1512, 1513 and 1514 acting as bit lines (BL), and second access lines 1531, 1532, 1533 and 1534 acting as word lines (WL). The second access lines can include active areas for the diodes (e.g. 1544D) in the memory cells, and can be connected to contacts (e.g. 1551, 1552, 1553 and 1554) for word line pickup. In one implementation, the bit lines can be disposed in a metal layer 1, above the word lines that can include polysilicon. The first and second access lines are connected to memory cells (e.g. 1544), as described in connection with FIG. 15. The memory cells include memory elements (e.g. 1541M, 1542M, 1543M and 1544M) that can include the metal oxide layer 170 as shown in FIG. 8. The memory cells can include the first layer of barrier material 181, and the second layer of barrier material 182 above the memory elements as shown in FIG. 1.

Figure 17:
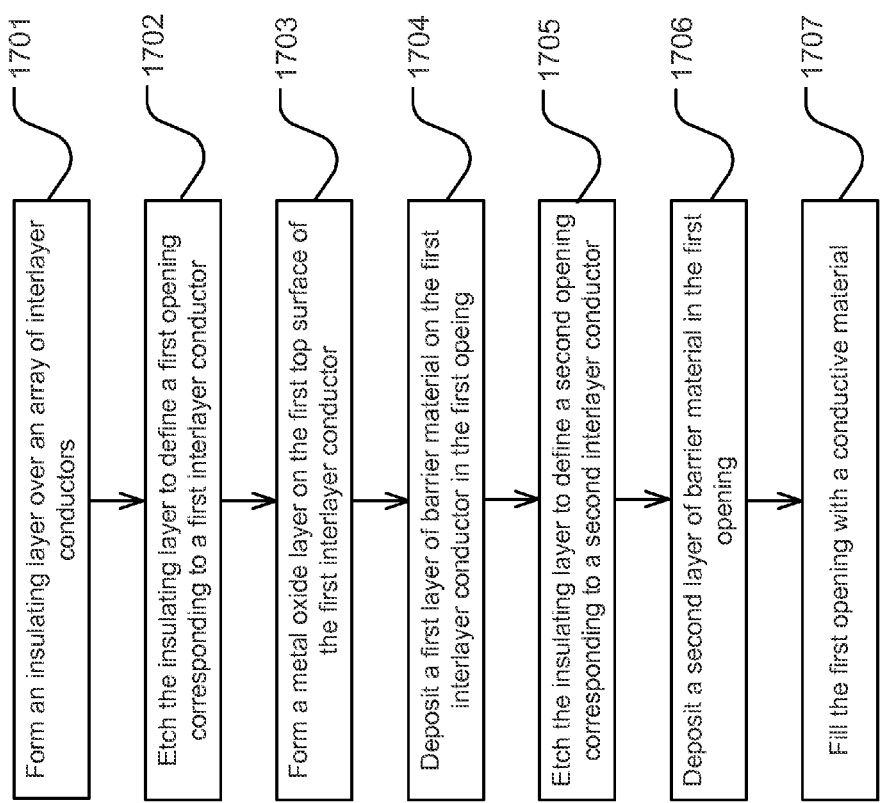
FIG. 17 illustrates a simplified flowchart of an embodiment of a method for manufacturing a memory device.

FIG. 17 illustrates a simplified flowchart of an embodiment of a method for manufacturing a memory device. At Step 1701, an insulating layer is formed over an array of interlayer conductors. A diffusion barrier layer can be formed between top surfaces of the array of interlayer conductors and the insulating layer, and contacting the top surfaces. At Step 1702, the insulating layer is etched to define a first opening corresponding to a first interlayer conductor in the array, where the etching stops at a first top surface of the first interlayer conductor. When etching to define the first opening, a first etch mask can be used over the insulating layer, where the first etch mask has a mask region corresponding to the second opening and a spaced apart region corresponding to the first opening.

At Step 1703, a metal oxide layer is formed on the first top surface of the first interlayer conductor in the first opening. The metal oxide layer can be characterized by having a programmable resistance. At Step 1704, a first layer of barrier material is deposited conformal with and contacting the metal oxide layer on the first interlayer conductor and surfaces of the first opening. The first layer of barrier material can protect the metal oxide layer from potential damage by subsequent manufacturing steps to form and then remove etch masks over the metal oxide layer, thus providing better interface between the metal oxide layer and the top electrode.

At Step 1705, subsequent to depositing the first layer of barrier material, the insulating layer is etched to define a second opening corresponding to a second interlayer conductor in the array, where the etching stops at a second top surface of the second interlayer conductor. When etching to define the second opening, a second etch mask can be used over the insulating layer, where the second etch mask has a mask region corresponding to the first opening and a spaced apart region corresponding to the second opening. At Step 1706, a second layer of barrier material is deposited conformal with and contacting the first layer of barrier material in the first opening. The second layer of barrier material can also be deposited conformal with and contacting the second top surface of the second interlayer conductor in the second opening and surfaces of the second opening, for example at the same step.

At Step 1707, the first opening is filled with a conductive material. The second opening can also be filled with the conductive material, for example at the same step, where a layer comprised of a metal oxide is not present between the second top surface and the second layer of barrier material. The first opening can have a width greater than a width of the first interlayer connector.

The first and second interlayer conductors can be connected to first and second terminals of an access device respectively. An access device can include a diode or a transistor. An array of access devices can be formed coupled to the array of interlayer conductors including the first and second interlayer conductors.

It will be understood that the memory array is not limited to the array configuration illustrated in FIG. 12 and additional array configurations can also be used with memory cells including a top electrode layer as disclosed above. Additionally, instead of MOS transistors, bipolar transistors or diodes may be used as access devices in some embodiments.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A method of manufacturing a memory, comprising:
   forming an insulating layer over an array of interlayer conductors;
   etching the insulating layer to define a first opening corresponding to a first interlayer conductor in the array, stopping at a first top surface of the first interlayer conductor;
   forming a metal oxide layer on the first top surface of the first interlayer conductor in the first opening;
   depositing a first layer of barrier material conformal with and contacting the metal oxide layer on the first interlayer conductor and surfaces of the first opening, wherein the first opening has a width greater than a width of the first interlayer conductor;
   etching the insulating layer to define a second opening corresponding to a second interlayer conductor in the array, stopping at a second top surface of the second interlayer conductor, subsequent to said depositing the first layer of barrier material;
   depositing a second layer of barrier material conformal with and contacting the first layer of barrier material in the first opening; and
   filling the first opening with a conductive material,
   wherein the first and second interlayer conductors are connected to first and second terminals of an access device respectively.

2. The method of claim 1, comprising:
   forming a diffusion barrier layer between top surfaces of the array of interlayer conductors and the insulating layer and contacting the top surfaces.

3. The method of claim 1, said etching to define the first opening comprising:
   using a first etch mask over the insulating layer, the first etch mask having a mask region corresponding to the second opening and a spaced apart region corresponding to the first opening.

4. The method of claim 1, said etching to define a second opening comprising:
   using a second etch mask over the insulating layer, the second etch mask having a mask region corresponding to the first opening and a spaced apart region corresponding to the second opening.

5. The method of claim 1, said depositing the second layer of barrier material comprising:
   depositing the second layer of barrier material conformal with and contacting the second top surface of the second interlayer conductor in the second opening and surfaces of the second opening; and
   filling the second opening with the conductive material.

6. The method of claim 1, comprising:
   forming a first access line electrically connected to the metal oxide layer; and
   forming a second access line electrically connected to the second interlayer conductor.

7. The method of claim 1, comprising:
   forming an array of access devices coupled to the array of interlayer conductors, and including the first mentioned access device.

8. The method of claim 1, wherein the first mentioned access device includes a diode.

9. The method of claim 1, wherein the first mentioned access device includes a transistor, comprising:
   forming a third access line electrically connected to a gate terminal of the transistor.

10. The method of claim 1, wherein the metal oxide layer is characterized by having a programmable resistance.

11. The method of claim 1, wherein the first interlayer connector consists essentially of a metal, and the metal oxide layer comprises an oxide of the metal.

12. The method of claim 1, wherein the first interlayer connector consists essentially of a transition metal, and the metal oxide layer comprises an oxide of the transition metal.

* * * * *